United States Patent [19]

Sardo et al.

[11] Patent Number: 5,032,881
[45] Date of Patent: Jul. 16, 1991

[54] ASYMMETRIC VIRTUAL GROUND EPROM CELL AND FABRICATION METHOD

[75] Inventors: George M. Sardo; Albert M. Bergement, both of San Jose, Calif.

[73] Assignee: National Semiconductor Corporation, Santa Clara, Calif.

[21] Appl. No.: 546,378

[22] Filed: Jun. 29, 1990

[51] Int. Cl.$^5$ .................... H01L 29/68; G11C 11/34
[52] U.S. Cl. ...................... 357/23.5; 357/90; 357/91; 357/89; 365/185
[58] Field of Search ............ 357/23.5, 89, 91, 90; 365/185

[56] References Cited

U.S. PATENT DOCUMENTS

| | | | |
|---|---|---|---|
| 4,376,947 | 3/1983 | Chiu et al. | 357/23.5 |
| 4,698,787 | 10/1987 | Mukherjee et al. | 365/185 |
| 4,930,105 | 5/1990 | Matsumoto et al. | 357/23.5 |

OTHER PUBLICATIONS

Yoshikawa et al., "An Asymmetrical Lightly Doped Source Cell . . . ", IEEE Transactions on Electron Devices, vol. 37, No. 4, Apr. 1990, pp. 1046–1051.
Chu et al., "The Effect of Trench-Gate-Oxide Structure on EPROM Device Operation", IEEE Electron Device Letters, vol. 9, No. 6, Jun. 1988, pp. 284–286.

Primary Examiner—Rolf Hille
Assistant Examiner—Robert P. Limanek
Attorney, Agent, or Firm—Flehr, Hohbach, Test, Albritton & Herbert

[57] ABSTRACT

An array of asymmetric electrically programmable, read only memory (EPROM) cells is formed in a P− semiconductor substrate. The EPROM cells are virtual ground cells, in that there are no fixed connections in the array to ground potential. Parallel bit lines, comprising N+ substrate regions, form the drain and source regions of parallel columns of MOS transistor devices. Each EPROM cell has a floating gate formed on a first polysilicon layer, and a control gate formed on a second polysilicon layer. Each bit line has two lateral edge regions. An N− implant region overlaps one lateral edge region of each bit line, thereby forming a graduated PN junction between the drain and channel of each MOS transistor device. This substantially prevents hot electron generation by the drain and enables one cell to be programmed without programming of its nearest neighboring cell. A second P− implant region overlaps the other lateral edge region of each bit line, forming a sharp PN junction between the source and channel of each adjacent MOS transistor device, thereby enhancing hot electron generation, which makes the programming of cells more efficient.

5 Claims, 3 Drawing Sheets

ASYMMETRIC VIRTUAL GROUND EPROM CELL AND FABRICATION METHOD

The present invention relates generally to the memory cells used in an electrically programmable read only memory (EPROM), and particularly to a virtual ground EPROM cell suitable for use in very high density EPROMs and a method for fabricating such cells.

BACKGROUND OF THE INVENTION

EPROMs are read only memories which are electrically programmed using a technique called hot electron injection. The operation of prior art EPROM cells will be described below.

Standard Prior Art Symmetric EPROM Cell

The following discussion of standard symmetric EPROM cells is provided so that those not skilled in the art will understand the basic device profile and method of operation of EPROM cells. Those familiar with such cells may wish to skip to the last paragraph of this discussion.

In accordance with the standard terminology used in the semiconductor industry, polycrystalline silicon is herein called "polysilicon". A first layer of polysilicon which is deposited and patterned on the device is called "the first polysilicon layer", or Poly 1, and a second polysilicon layer to be deposited and patterned is called "the second layer of polysilicon", or Poly 2.

FIG. 1 shows a typical prior art EPROM device 100 using symmetric cells. The device is typically formed in a P-silicon substrate 102, so that the cells are N-channel MOS transistors. Each EPROM cell, such as cell 104, has a floating gate 106 formed from a first polysilicon layer (Poly 1), and a control gate 108, 109 formed from a second lo polysilicon layer (Poly 2). To facilitate the injection of hot electrons for programming, a thin gate oxide 110 having a thickness of 200 to 300 angstroms is formed under the floating gate 106. The control gate 108 sits atop an oxide/nitride/oxide layer 112, having an oxide equivalent thickness of 200 to 300 angstroms, depending on the manufacturing process used.

Cells are arranged in pairs of rows, with each pair of rows sharing a source line 114. The source line 114 comprises a diffusion region running the lengthwise down the memory array. On each outer boundary of the pair of rows is a diffusion region 120, 122 coupled to a metal word line 130. There are also overlying metal lines (not shown), parallel to metal word line 130, which are connected to the source line 114 once every thirty-two columns of cells or so.

Each column of cells is coupled to a metal word line 130, which is coupled to the diffusion regions 120 and 122 of all the cells that particular column of cells.

The memory array 100 works as follows. To program a specified cell 104, the corresponding Poly 2 control gate 108 is brought to a high voltage (e.g., typically 12.5 volts), and then a high voltage (e.g., 7 to 8 volts), is applied to the cell's source line 114–116. This not only causes current to flow through the cell's transistor but also causes the creation of hot electrons which are injected into the floating gate 106—a process which is called hot electron injection. As a result, the floating gate 106 of the selected cell is given a negative voltage potential, which strongly turns off the transistor channel 132 under the floating gate.

During normal read operations, a cell is accessed by applying a normal Vcc voltage (e.g., five volts) to the cell's source line and then enabling the corresponding word line 130. If the source line 114 is pulled low by the cell, that cell's floating gate has not been programmed, and the cell is said to store a "0" bit. If the source line 114 is not pulled low by the cell, that cell's floating gate has been programmed, and the cell is said to store a "1" bit. Of course, the logical state assigned to programmed and unprogrammed cells can be reversed from that stated above without changing the cells themselves.

The standard EPROM cell shown above has several disadvantages which have led to the development of alternative cells. Most prominent of these disadvantages are the size of the cell and the large number of contacts from metal to diffusion, typically one for every two cells, which results in a large cell size. There is a certain statistical probability that any particular contact will not be properly formed, and therefore the larger the memory array the lower the yield. Improvements in the reliability of fine line lithography have not yet been matched by improvements in forming contacts.

Symmetric Virtual Ground EPROM Cell

The first attempt to overcome the cell size problem associated with the earlier EPROM cells (shown in FIG. 1) was to eliminate the ground lines, resulting in the EPROM device 150 shown in FIG. 2. By eliminating the ground line connections, it is possible to have a continuous Poly 2 word line 152 directly forming the control gates for a row of EPROM cells. As before, each EPROM cell, such as cell 154, has a floating gate 156 formed from a first polysilicon layer (Poly 1), and a control gate 158 formed from a second polysilicon layer (Poly 2). Although not shown, there is a metal line running over each N+ diffusion bit line 160, with contacts therebetween every thirty-two rows or so.

To program a cell 154, the corresponding word line is brought to a high voltage (e.g., typically 12.5 volts), a high voltage (e.g., 7 to 8 volts) is applied to one of bit lines 160 adjacent the cell and a ground potential (zero volts) is applied to the other adjacent bit line 162. This causes current to flow through the cell's transistor and also causes the creation of hot electrons which are injected into the floating gate. As a result, the floating gate 106 of the selected cell is given a negative voltage potential, which strongly turns off the transistor channel 164 under the floating gate.

During read operations, a cell is accessed by applying a normal Vcc voltage (e.g., five volts) to one of the cell's adjacent bit lines 160, and a ground potential to the other adjacent bit line 162, and then enabling the corresponding word line 151. If the bit line 160 is pulled low by the cell, that cell's floating gate has not been programmed, and the cell is said to store a "0" bit. If the bit line is not pulled low by the cell, that cell's floating gate has been programmed, and the cell is said to store a "1" bit.

This type of EPROM cell 154 is said to have a virtual ground because there is no fixed ground line. The primary advantage of this cell 154 is that it is small due to the smaller number of metal to diffusion contacts in the array. For example, there will typically be less than 300,000 contacts in a four megabit EPROM using this cell.

This cell, however, has a serious disadvantage. The closest neighboring cell 170 will also be programmed when cell 154 is programmed, unless preventative measures are taken. This is because hot electrons will also be injected from diffusion 160 into the channel 172 under cell 170, causing its floating gate 174 to become charged. There is a well known solution to this problem, called "source decoding". Essentially, when programming cell 154 using a programming voltage on bit line 160, one must have specially decoder circuitry at the edge of the array for asserting a high voltage on all the bit lines (including bit line 180) on the "right (or left) side" of the cell being programmed. Asserting high voltages on these bit lines will prevent current from flowing into the channels of the other transistors in the row, which will prevent the unwanted programming of those cells.

The problem with this "source decoding" solution is that it is expensive in terms of die size, and is also expensive in terms of the power expended during programming and the speed of programming.

Asymmetric Virtual Ground EPROM Cell

The second attempt to overcome the cell size problem associated with the earlier EPROM cells (shown in FIG. 1) was to modify the cell design of FIG. 2 by making the bit lines asymmetric, resulting in the EPROM device 200 shown in FIG. 3. As shown, the bit lines 202 and 204 adjacent the channel 206 under cell 210 are asymmetric. Not immediately evident from FIG. 3 is the fact that during read operations the Poly 2 control gate creates an inversion region in substrate area 220 between the bit line 202 and the channel 206 of the floating gate. In other words, area 220 is gated by the Poly 2 word line 222 and is part of the channel of the MOS transistor in cell 210. As a result, the cell 210 is able to function as a standard double-gated MOS transistor during read operations.

When a programming voltage is applied to bit line 204, cell 210 is programmed but cell 212 is not, because bit line 204 is sufficiently set back from the channel 216 under cell 212 to prevent hot carriers from being injected into the floating gate 218 of cell 212. Rather, the hot carriers are injected into the Poly 2 control gate 222. Thus, the asymmetric cells used in EPROM device 200 overcomes the problem of unwanted programming of nearest neighbor cell 212 while programming cell 210.

However, this EPROM cell design creates a new problem. In particular, this cell is difficult to scale down for higher density EPROMs (e.g., using 0.8 micron design rules). The reason for this is that the cell design needs to leave room for misalignments of the bit line mask to the Poly 1 mask and for N+ lateral diffusion variations of perhaps 0.15 microns. As a result, the minimum cell size using this design is around 3.68 square microns (i.e. a cell with dimensions of 1.6 by 2.3 microns).

In light of the above discussion of prior art EPROM cells, the primary object of the present invention is to overcome the shortcomings associated with prior art virtual ground EPROM cells. Thus, it is an object of the present invention to provide a virtual ground EPROM cell that does not require source decoding and which can be scaled down for use in high density EPROMs.

SUMMARY OF THE INVENTION

In summary, the present invention is an array of asymmetric electrically programmable, read only memory (EPROM) cells. The EPROM cells are virtual ground cells, in that there are no fixed connections in the array to ground potential.

Each cell has a drain, source and channel region, with a floating gate formed from the first patterned layer of polysilicon overlying a portion of the cell's channel region, and a control gate formed from the second patterned polysilicon layer overlying the floating gate. Thus each EPROM cell is a double-gated field effect (i.e., MOS) transistor.

The transistor's channel region is separated from the source and drain by two distinct PN junctions. One of these two PN junctions has a relatively sharp doping gradient, suitable for generating hot electrons which are used to program the cell, and the other PN junction has a relatively gradual doping gradient which substantially reduces the generation of hot electrons and thereby enables one cell to be programmed without programming of the neighboring cell.

In the preferred embodiment, parallel bit lines, comprising N+ substrate regions, form the drain and source regions of parallel columns of MOS transistor devices. Each bit line has two lateral edge regions. An N− implant region overlaps one lateral edge region of each bit line, thereby forming a graduated PN junction between the drain and channel of each MOS transistor device. This substantially prevents hot electron generation by the drain and enables one cell to be programmed without programming of its nearest neighboring cell. A second P− implant region overlaps the other lateral edge region of each bit line, forming a sharp PN junction between the source and channel of each adjacent MOS transistor device, thereby enhancing hot electron generation, which makes the programming of cells more efficient.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 4:
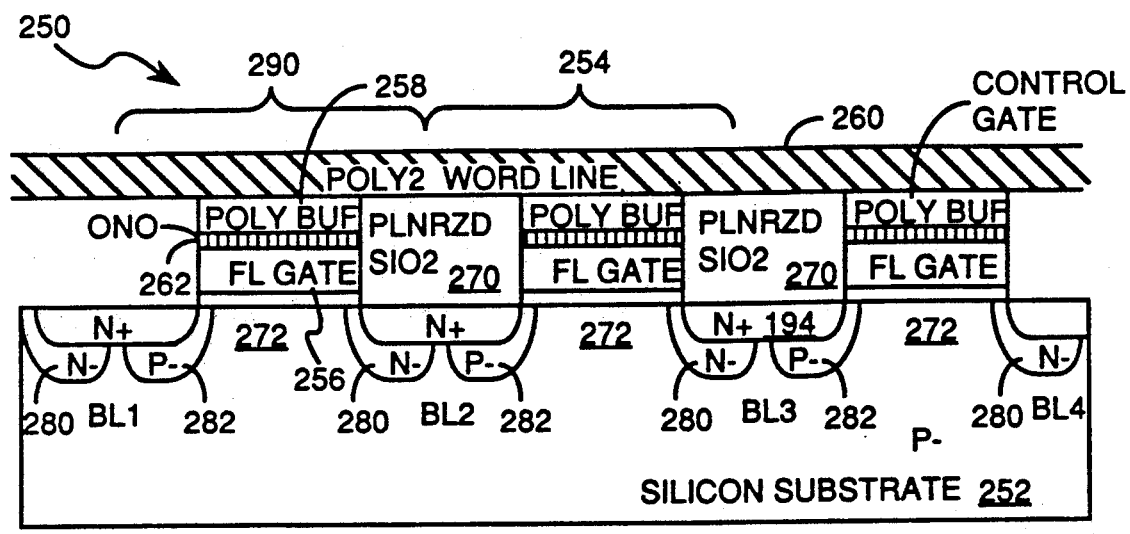
FIG. 4 is a cross-sectional view of a preferred embodiment of the present invention.

Referring to FIG. 4, there is shown an EPROM device 250 having asymmetric cells. The device is formed in a P-silicon substrate 252. Each EPROM cell, such as cell 254, has a floating gate 256 formed from a first polysilicon layer (Poly 1), and a control gate 258 formed from a second polysilicon layer called the polysilicon buffer or Poly Buffer layer. A polysilicon word line 260 is coupled to all the control gates of the cells in a particular row of the memory device, formed on the layer called Poly 2.

The Poly 1 floating gate 256 and the polysilicon buffer control gate 258 are separated by an insulator 262. In the preferred embodiment, this insulator 262 is an "ONO" (oxide, nitride, oxide) sandwich comprising a layer of silicon nitride with layers of silicon oxide above and below the layer of silicon nitride.

The gates 256 and 258 of each cell are separated from neighboring cells by planarized regions of silicon dioxide 270. As will be understood by those skilled in the art, the purpose of the polysilicon buffers 258, besides forming the control gate 258 of each cell, is to protect the insulator 262 between the two gates 256 and 258 during the oxide planarization step of the manufacturing process. In other words, by forming such polysilicon buffers, the ONO insulator 262 is protected while the oxide regions 270 between cells are cut back so as to planarize the circuitry below the Poly 2 layer.

As shown, the bit lines BL1 and BL2 adjacent the channel 272 under cell 254 are asymmetric. Each has an N− doped implant region 280 on one lateral side and a P− doped implant region 282 on the other lateral side of the bit line. As a result, the transistor's channel region 272 is coupled to the source and drain diffusion regions by two distinct types of PN junctions. The PN junction located at the junction of the P− implant region 282 and the bit line BL1 has a relatively sharp doping gradient, suitable for generating hot electrons which are used to program the cell. The other PN junction, located where the N− implant region 280 overlaps the bit line BL1, has a relatively gradual doping gradient which substantially, prevents the generation of hot electrons. The gradual PN gradient near the N− implant region 280 enables one cell (e.g., cell 254) to be programmed without programming of the nearest neighboring cell. That is, the cell to the left of cell 254, which is cell 290, is not programmed by hot electrons from bit line BL2 when cell 254 is programmed.

The phrase "substantially prevents the generation of hot electrons" means that the generation of hot electrons is reduced so substantially that there is no significant programming of (i.e., injection of hot electrons into) the adjacent floating gate. Hot electron generation is not completely suppressed, but is suppressed very substantially by the gradual gradient formed by the N− implant region 280.

Figure 1:
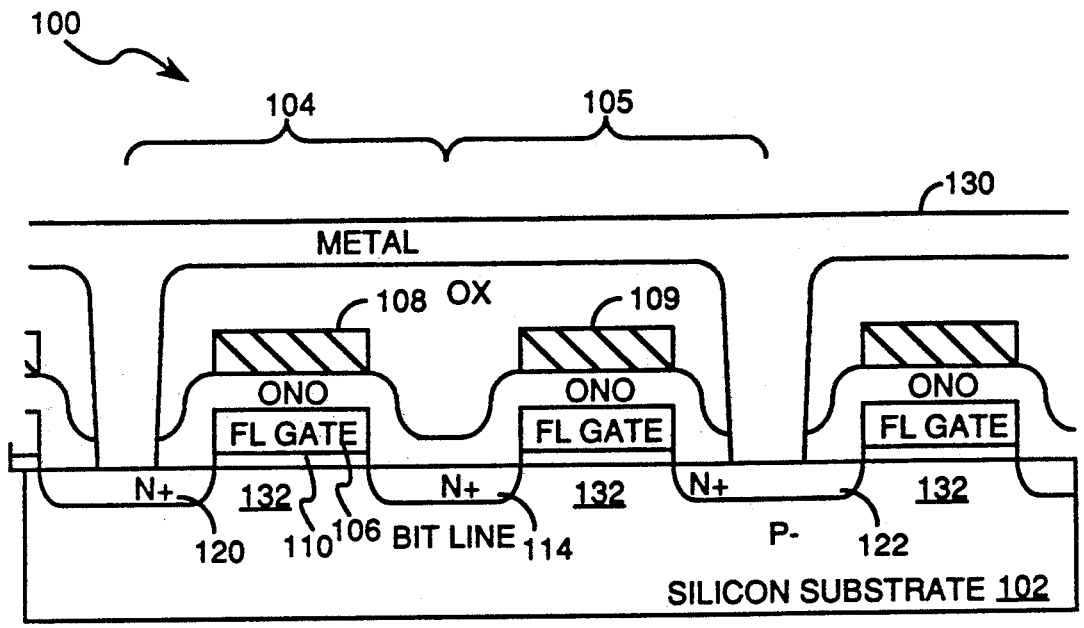
FIG. 1 is a cross-sectional view of a first prior art EPROM cell.
Figure 2:
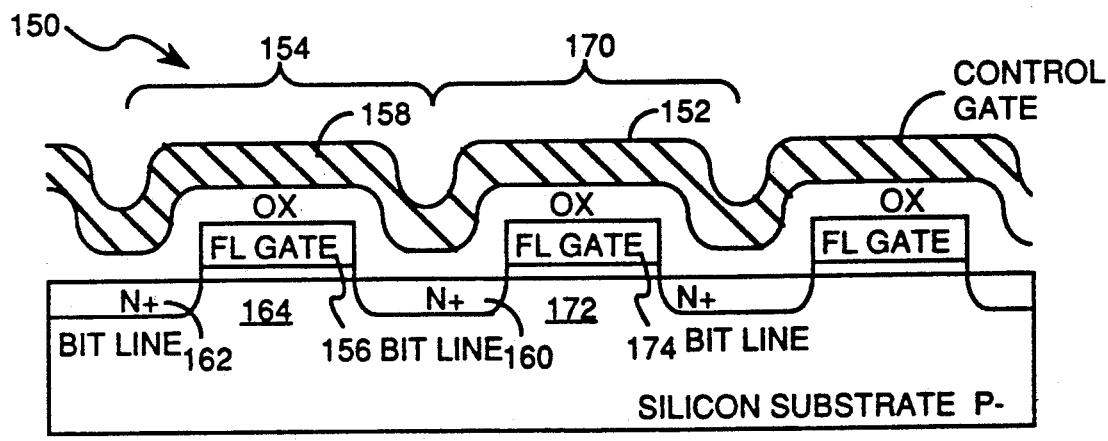
FIG. 2 is a cross-sectional view of a second prior art EPROM cell.
Figure 3:
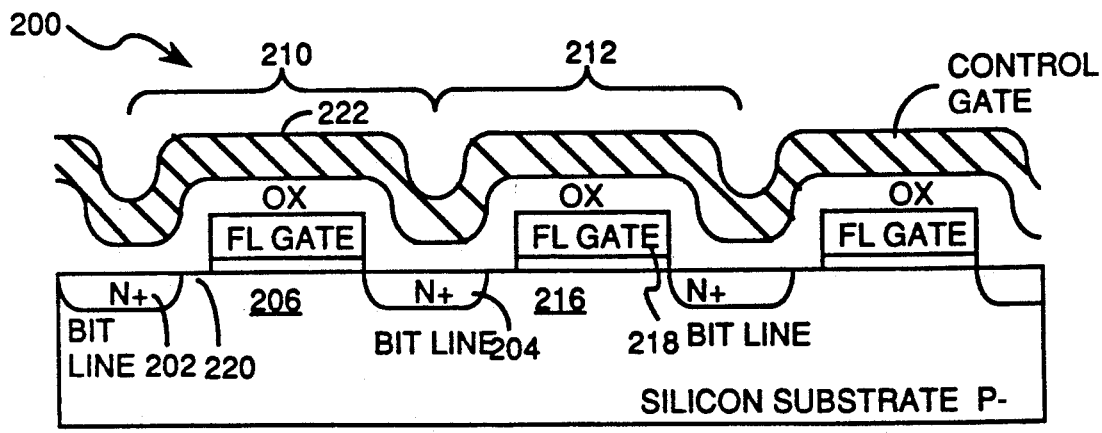
FIG. 3 is a cross-sectional view of a third prior art EEPROM cell.

Note that, unlike the prior art asymmetric EPROM cell shown in FIG. 3, the tit line diffusion regions in the present invention are totally self-aligned with the floating gates of adjacent columns of cells, thereby eliminating the possibility of mask misalignment (which prevents scaling down of the cell in FIG. 3). This is an important distinction for enabling use of the cell with increasingly small design rules. In the present invention, programming of the nearest neighbor is prevented by forming an overlapping and deeper N− implant region 280, which forms a graduated PN junction that is a poor generator of hot electrons. This is unlike the prior art asymmetric cell, which generates ho&: electrons on both sides of the bit line diffusion regions, but spaces the bit line sufficiently far away from one of the adjacent cells to avoid programming it.

Figure 5:
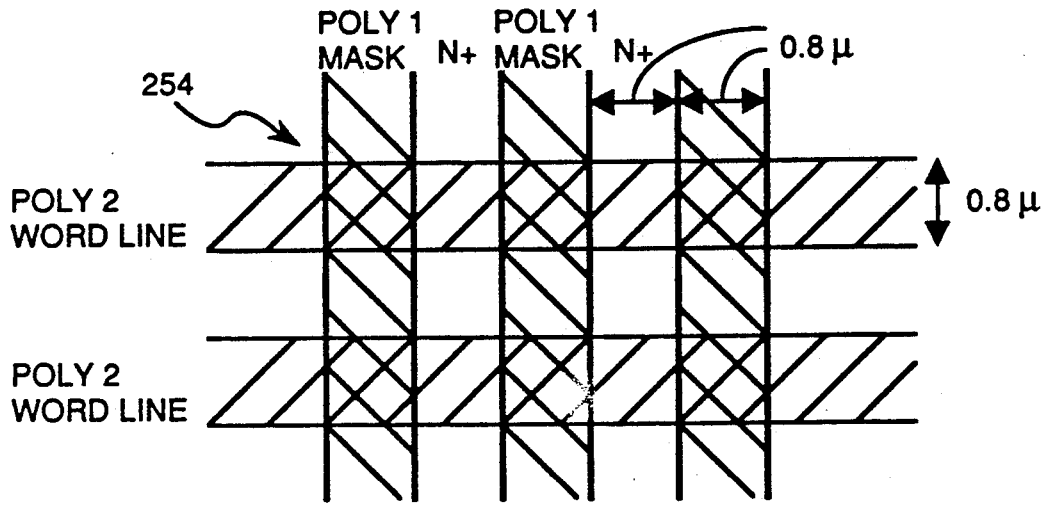
FIG. 5 is a plan view of the first and second polysilicon masks for the EPROM memory device shown in FIG. 4.

Referring to FIG. 5, there is shown a plan view of the first and second polysilicon masks for the EPROM memory device shown in FIG. 4. The Poly 1 floating gate layer is initially formed as continuous vertical columns. These Poly 1 columns are used to mask the substrate when making the N+ diffusion for forming bit lines. Then, after depositing the Poly 2 layer and forming a mask for the Poly 2 layer, the portions of the Poly 1 layer not protected by Poly 2 are etched away.

As can be seen from FIG. 5, the region occupied by each EPROM cell 154 (see cross hatched areas in FIG. 5) using 0.8 micron design rules is 1.6 microns on each side, for a total area of 2.56 square microns.

Processing Methodology

Referring to FIGS. 6A-6D, the EPROM cell 254 shown in FIGS. 4 and 5 is manufactured as follows. The starting material is a wafer of P− type monocrystalline silicon. The substrate 252 shown in the Figures comprises a small portion of a wafer. The steps for initially preparing the wafer and for forming field oxide are well known to those skilled in the art and are not therefore described here.

Figure 6A:
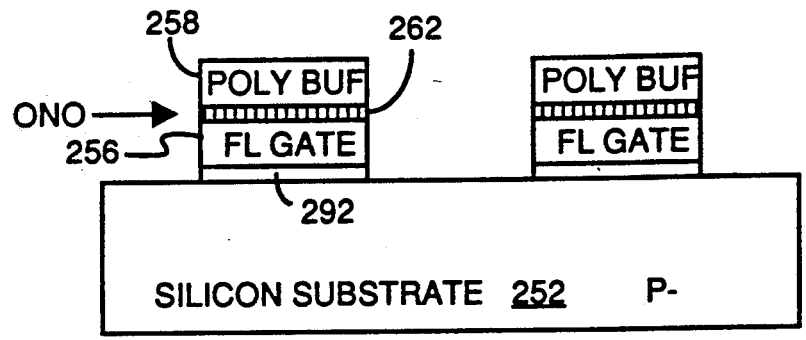
FIGS. 6A-6D are cross-sectional views of a EPROM device according to the present invention at various states of manufacture.

Referring to FIG. 6A, this description of the manufacturing process begins after the formation of floating gates with an overlying polysilicon buffer, and planarization. The steps for getting to this point are, in sequence:

1) form a thin gate oxide 292 of approximately 200 to 300 angstroms;
2) deposit an overlying Poly 1 floating gate layer, and subject it to phosphorus deposition to render it highly conductive;
3) form ONO insulator layer 262;
4) deposit polysilicon buffer layer; and
5) pattern and etch Poly 1 columns using conventional photoresist masking and etching.

These processing steps are prior art processing steps well known to those skilled in the art and are therefore not further described here.

Figure 6B:
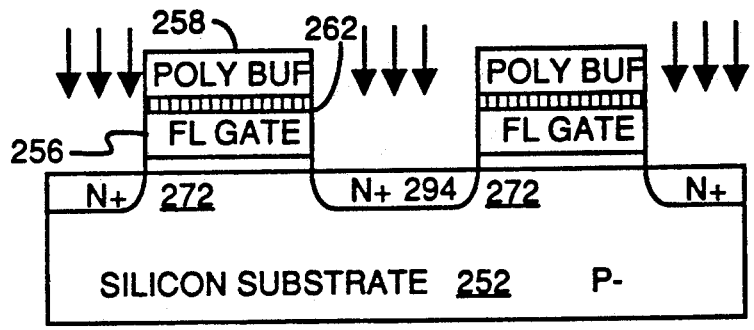
Figure 6C:
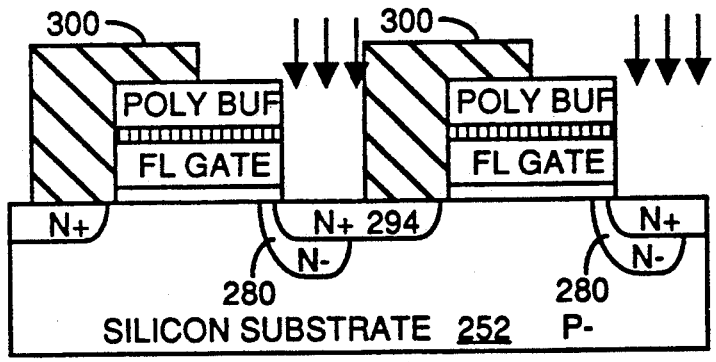
Figure 6D:
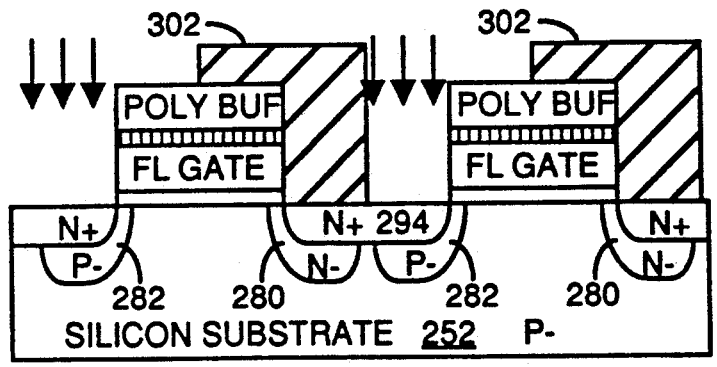

As shown in FIG. 6B, the next step is to form N+ bit line diffusion regions 294. In the preferred embodiment, diffusion regions 294 are formed using an N+ ion (i.e., arsenic). This implant is self aligned with the floating gate 256 and produces a steep PN junction between the bit line diffusion regions 294 and the channel 272.

In step 6C, approximately one half each bit line diffusion region is masked off by mask 300, and an N− ion (preferably phosphorus) implant is performed to produce N− regions 280. See the circuit profile shown in FIG. 6C.

Next, in step 6D, mask 300 is removed and a complementary mask 302 is formed to open a window to the other half of the bit line diffusion regions. A P− ion (preferably boron) is implanted to produce P− regions 282, as shown by the circuit profile in FIG. 6D.

The order of steps 6C and 6D makes no difference, and therefore can be reversed. Furthermore, the bit line implant step (shown in FIG. 6B) may be followed by a brief heating step to drive the bit line diffusion to a predefined target doping profile. Note that an annealing step is not required after the implant steps 6C and 6D because later processing steps use sufficient heat to activate the implanted ions.

In summary, cell asymmetry is formed by alternate bit line source/drain tailoring with N− and P− implants. Using 0.8 micron design rules allows an N− region 280 to be implanted through a critical 0.8 micron minimum line width mask with a 0.25 micron alignment tolerance. The N− region 280 will form a graded junction and prevent nearest neighbor programming by reducing, and virtually eliminating, hot electron generation.

The P— implant provides further cell asymmetry. The P— region 282 is implanted with a critical mask 302 similar to the N— mask 300 but with a reverse image in the cell array. The P— region 282 enhances cell programming by improving hot electron generation efficiency. The P— region 282 also helps to reduce drain turn-on and improves the bit line to bit line punch-through performance by widening the transistor channel. These process steps are followed by growing field oxide, and then planarizing the resulting structure.

Next, Poly 2 is deposited and doped to make it conductive. Then the Poly 2 layer is patterned and etched using conventional photoresist masking and etching. Note that this step etches away the Poly 1 regions not underlying Poly 2 word lines. Note that the above referenced planarization step is required to prevent N+ bit line trenching (discontinuities) during the self-aligned stacked gate etching. Referring to FIG. 5, if planarization were not performed, the latter etch step (of Poly 1 regions not underlying Poly 2 word lines) would etch portions of the substrate where the N+ bit lines are located—thereby forming discontinuities in the N+ bit lines.

Finally, as will be understood by those skilled in the art, metal layers are deposited and patterned, and connected through contact windows to underlying diffusion and polysilicon regions in the usual fashion to produce the completed device.

SECOND PREFERRED EMBODIMENT

Figure 7:
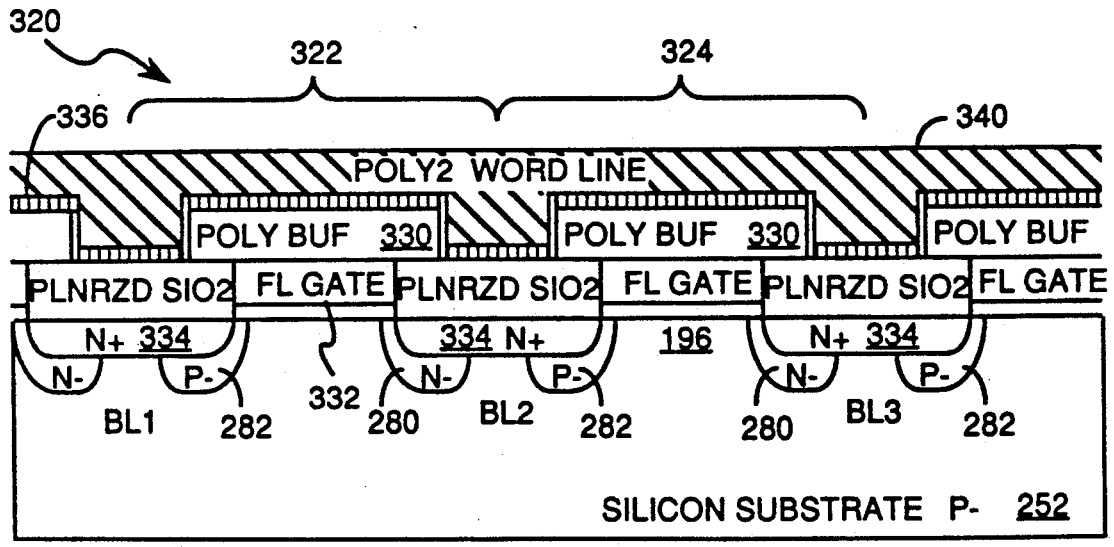
FIG. 7 is a cross-sectional view of a second preferred embodiment of the present invention.

Referring to FIG. 7, there is shown a cross-sectional view of an EPROM device 320 which incorporates a second preferred embodiment of the present invention. In this variation, each cell 322, 324 has a broader polysilicon buffer 330 which is directly connected to the Poly 1 floating gate 332. The bit line diffusion region 334 is also broader in these cells, having a width of 1.4 microns instead of 0.8 microns.

The oxide-nitride-oxide insulator layer 336 in these cells is formed between the Poly Buffer 330 and the Poly 2 word line 340. The same N— and P— implant regions 280 and 282 as in the first preferred embodiment (shown in FIG. 4) are used to form asymmetric cells.

This cell design improves the gate coupling ratio (i.e., the coupling of the Poly 2 word line 340 to the floating gate 332) and decreases the chance of drain turn-on by the addition of polysilicon wings above the planarization formed between the Poly 1 floating gates. As can be seen from the shape of the polysilicon buffer 330, the N— and P— implants must be performed prior to the formation of the polysilicon buffers 330. While this EPROM cell 322 is somewhat larger (2.2 microns by 1.6 microns, for a total area of 3.52 square microns) than the EPROM cell shown in FIG. 4, this cell has better performance characteristics and may therefore it may be possible to scale this design down to smaller design rules.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An asymmetric electrically programmable, nonvolatile, floating gate semiconductor memory device, comprising:
   a plurality of rows of MOS transistor devices;
   each MOS transistor device formed in a semiconductor substrate of a first type and having a source and drain of the opposite type, a channel area between said source and drain, a floating gate overlying said channel area, a control gate overlying said floating gate, and an implant region of said opposite type located where said channel area meets said drain; wherein said implant region forms a graduated PN junction with said channel area, thereby substantially preventing hot electron generation by said drain; and
   a plurality of parallel control lines, each control line coupled to the control gates i none said row of MOS transistor devices;
   wherein neighboring MOS transistor devices in each said row share a diffusion region comprising the drain of one and the source of the other one of said neighboring MOS transistor devices.

2. An asymmetric memory cell as set forth in claim 1, further including a second implant region of said first type located where said channel area meets said source; wherein said second implant region forms a sharp PN junction with said channel area, thereby enhancing hot electron generation by said source.

3. An array of asymmetric electrically programmable, nonvolatile, floating gate semiconductor memory cells comprising:
   a semiconductor substrate of a first type;
   a multiplicity of parallel bit lines, comprising substrate regions of the opposite type as said first type;
   an array of MOS transistor devices formed in said semiconductor substrate, each MOS transistor having a source comprising one of said bit lines, a drain comprising another one of said bit lines, a channel area between said source and drain, and a floating gate overlying said channel; and
   a multiplicity of parallel control lines, perpendicular to said bit lines, each control line including a set of control gates overlying said floating gates of a row of said array;
   each said bit line having two lateral edge regions, a first one of said lateral edge regions forming the drain of a column of said MOS transistor devices and the second one of said lateral edge regions forming the source of another column of said mOS transistor devices;
   each said bit line having an implant region of said opposite type overlapping said first one of said lateral edge regions; wherein said implant region forms a graduated PN junction with said channel area, thereby substantially preventing hot electron generation by said MOS transistor device drains;
   whereby andy specified MOS transistor in said array can be programmed by asserting programming voltages on the control line and bit line corresponding to said specified MS transistor, and whereby programming of a neighboring MOS transistor also coupled to said corresponding bit line and control line is automatically prevented by said bit line implant region forming a graduated PN junction without having to assert programming prevention voltages on other ones of said bit lines.

4. An array of asymmetric memory cells as set forth in claim 3, each said bit line having a second implant region of said first type overlapping said second one of said lateral edge regions; wherein said second implant region forms a sharp PN junction with said channel area of each adjacent MOS transistor device, thereby enhancing hot electron generation by said MOS transistor device sources.

5. An array of asymmetric memory cells as set forth in claim 3, wherein said floating gate and control gates are polycrystalline silicon.

* * * * *